United States Patent
Moors et al.

(10) Patent No.: US 11,784,264 B2
(45) Date of Patent: Oct. 10, 2023

(54) SINGLE-STEP METAL BOND AND CONTACT FORMATION FOR SOLAR CELLS

(71) Applicant: Maxeon Solar Pte. Ltd., Singapore (SG)

(72) Inventors: Matthieu Moors, Braine-le-Château (BE); Taeseok Kim, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 140 days.

(21) Appl. No.: 17/389,149

(22) Filed: Jul. 29, 2021

(65) Prior Publication Data

US 2021/0359145 A1 Nov. 18, 2021

Related U.S. Application Data

(63) Continuation of application No. 16/791,951, filed on Feb. 14, 2020, now Pat. No. 11,081,601, which is a
(Continued)

(51) Int. Cl.
| | | |
|---|---|---|
| *H01L 31/0224* | (2006.01) | |
| *H01L 31/18* | (2006.01) | |
| *H01L 31/068* | (2012.01) | |

(52) U.S. Cl.
CPC ........ *H01L 31/022433* (2013.01); *H01L 31/022441* (2013.01); *H01L 31/0682* (2013.01);
(Continued)

(58) Field of Classification Search
CPC .... H01L 31/18; H01L 31/1864; H01L 31/186
See application file for complete search history.

(56) References Cited

U.S. PATENT DOCUMENTS

| | | |
|---|---|---|
| 3,993,533 A | 11/1976 | Milnes et al. |
| 4,058,418 A | 11/1977 | Lindmayer |
| (Continued) | | |

FOREIGN PATENT DOCUMENTS

| | | |
|---|---|---|
| CN | 102047777 | 5/2011 |
| CN | 102132423 | 7/2011 |
| (Continued) | | |

OTHER PUBLICATIONS

International Search Report and Written Opinion for PCT Patent Application No. PCT/US2014/071718 dated Mar. 30, 2015, 19 pgs.
(Continued)

*Primary Examiner* — Karen Kusumakar
(74) *Attorney, Agent, or Firm* — Schwabe, Williamson & Wyatt, P.C.

(57) ABSTRACT

A method for fabricating a solar cell is disclosed. The method can include forming a dielectric region on a surface of a solar cell structure and forming a first metal layer on the dielectric region. The method can also include forming a second metal layer on the first metal layer and locally heating a particular region of the second metal layer, where heating includes forming a metal bond between the first and second metal layer and forming a contact between the first metal layer and the solar cell structure. The method can include forming an adhesive layer on the first metal layer and forming a second metal layer on the adhesive layer, where the adhesive layer mechanically couples the second metal layer to the first metal layer and allows for an electrical connection between the second metal layer to the first metal layer.

20 Claims, 11 Drawing Sheets

Related U.S. Application Data continuation of application No. 16/167,379, filed on Oct. 22, 2018, now Pat. No. 10,566,474, which is a continuation of application No. 15/436,282, filed on Feb. 17, 2017, now Pat. No. 10,109,751, which is a continuation of application No. 14/874,254, filed on Oct. 2, 2015, now Pat. No. 9,577,139, which is a continuation of application No. 14/137,918, filed on Dec. 20, 2013, now Pat. No. 9,178,104.

(52) U.S. Cl.
CPC ............ *H01L 31/18* (2013.01); *H01L 31/186* (2013.01); *H01L 31/1864* (2013.01); *Y02E 10/547* (2013.01); *Y02P 70/50* (2015.11)

(56) References Cited

U.S. PATENT DOCUMENTS

| | | | |
|---|---|---|---|
| 4,318,938 A | 3/1982 | Barnett et al. | |
| 4,393,576 A | 7/1983 | Dahlberg | |
| 4,400,577 A | 8/1983 | Spear | |
| 4,433,200 A | 2/1984 | Jester et al. | |
| 4,461,922 A | 7/1984 | Gay et al. | |
| 4,482,780 A | 11/1984 | Mitchell | |
| 4,581,103 A | 4/1986 | Levine et al. | |
| 4,582,588 A | 4/1986 | Jensen et al. | |
| 4,617,421 A | 10/1986 | Nath et al. | |
| 4,691,076 A | 9/1987 | Levine et al. | |
| 4,695,674 A | 9/1987 | Bar-on | |
| 4,697,041 A | 9/1987 | Okaniwa et al. | |
| 4,882,298 A | 11/1989 | Moeller et al. | |
| 4,917,752 A | 4/1990 | Jensen et al. | |
| 4,957,601 A | 9/1990 | Levine et al. | |
| 5,091,319 A | 2/1992 | Hotchkiss et al. | |
| 5,380,371 A | 1/1995 | Murakami | |
| 5,951,786 A | 9/1999 | Gee et al. | |
| 5,980,679 A | 11/1999 | Severin et al. | |
| 6,159,832 A | 12/2000 | Mayer | |
| 6,288,326 B1 | 9/2001 | Hayashi et al. | |
| 6,448,155 B1 | 9/2002 | Iwasaki et al. | |
| 6,518,596 B1 | 2/2003 | Basore | |
| 6,635,307 B2 | 10/2003 | Huang et al. | |
| 7,355,114 B2 | 4/2008 | Ojima et al. | |
| 8,003,530 B2 | 8/2011 | Grohe et al. | |
| 8,146,643 B2 | 4/2012 | Kasahara et al. | |
| 8,766,090 B2 | 7/2014 | Sewell et al. | |
| 8,809,192 B2 | 8/2014 | Bertram et al. | |
| 9,040,409 B2 | 5/2015 | Kumar et al. | |
| 9,577,139 B2 | 2/2017 | Matthieu et al. | |
| 2004/0097062 A1 | 5/2004 | Preu et al. | |
| 2004/0159462 A1 | 8/2004 | Chung | |
| 2005/0253142 A1 | 11/2005 | Negami et al. | |
| 2006/0166023 A1 | 7/2006 | Yoshikata et al. | |
| 2006/0213548 A1 | 9/2006 | Bachrach et al. | |
| 2008/0042153 A1 | 2/2008 | Beeson et al. | |
| 2008/0128019 A1 | 6/2008 | Lopatin et al. | |
| 2008/0210301 A1 | 9/2008 | Mulligan et al. | |
| 2008/0216887 A1 | 9/2008 | Hacke et al. | |
| 2008/0223429 A1 | 9/2008 | Everett et al. | |
| 2008/0308892 A1 | 12/2008 | Wildpanner et al. | |
| 2009/0194162 A1 | 8/2009 | Sivaram et al. | |
| 2009/0223562 A1 | 9/2009 | Niira et al. | |
| 2010/0032013 A1 | 2/2010 | Krause et al. | |
| 2010/0051085 A1 | 3/2010 | Weidman et al. | |
| 2010/0084002 A1 | 4/2010 | Kutzer et al. | |
| 2010/0200058 A1 | 8/2010 | Funakoshi | |
| 2010/0243041 A1 | 9/2010 | Carlson et al. | |
| 2011/0000532 A1 | 1/2011 | Niira et al. | |
| 2011/0120552 A1 | 5/2011 | Meyer et al. | |
| 2012/0006394 A1* | 1/2012 | Richter ............... H01L 31/0504 257/E31.124 |
| 2012/0097245 A1 | 4/2012 | Nishina et al. | |
| 2012/0103408 A1 | 5/2012 | Moslehi et al. | |
| 2012/0204938 A1 | 8/2012 | Hacke et al. | |
| 2012/0234593 A1 | 9/2012 | Bottenberg et al. | |
| 2012/0240995 A1 | 9/2012 | Coakley et al. | |
| 2013/0160825 A1 | 6/2013 | Lantzer et al. | |
| 2013/0183796 A1 | 7/2013 | Stewart et al. | |
| 2014/0287583 A1 | 9/2014 | Liu et al. | |

FOREIGN PATENT DOCUMENTS

| | | |
|---|---|---|
| CN | 102947942 | 2/2013 |
| DE | 10020412 | 11/2001 |
| EP | 1634673 | 3/2006 |
| JP | 2003/246971 | 9/2003 |
| JP | 2009/130116 | 6/2009 |
| JP | 2011/054831 | 3/2011 |
| JP | 2012/501551 | 1/2012 |
| TW | 2010/27773 | 7/2010 |
| TW | 2012/44036 | 11/2012 |
| WO | WO 1999/040760 | 8/1999 |
| WO | WO 2010/025269 | 3/2010 |

OTHER PUBLICATIONS

International Preliminary Report on Patentability for PCT Patent Application No. PCT/US2014/071718, dated Jun. 30, 2016, 15 pgs.
First Action Interview Pilot Program Pre-Interview Communication from U.S. Appl. No. 14/137,918 dated Mar. 10, 2015, 3 pgs.
First Action Interview Pre-Interview Communication from U.S. Appl. No. 14/874,254 dated Jul. 5, 2016, 6 pgs.
First Action Interview Pilot Program Pre-Interview Communication from U.S. Appl. No. 15/436,282 dated Nov. 3, 2017, 6 pgs.
First Action Interview Office Action Summary from U.S. Appl. No. 15/436,282 dated Mar. 8, 2018, 11 pgs.
Second Office Action from Chinese Patent Application No. 2014800687727, dated Mar. 21, 2018, 1 pg.
Office Action from Taiwan Patent Application No. 103144746 dated Apr. 24, 2018, 4 pgs.
Third Office Action for Chinese Patent Application No. 2014800687727; dated Nov. 7, 2018; 9 pgs.
Decision of Rejection from Chinese Patent Application No. 2014800687727 dated Jun. 5, 2019, 7 pgs.
Non-final Notice of Reasons for Rejection from Japanese Patent Application No. 2018-182848 dated Oct. 16, 2019, 7 pgs.
Cotter, et al., "Novel Process for Simplified Buried Contact Solar Cells," Institute of Electrical and Electronics Engineers, Aug. 2000, pp. 303-306.
Fourth Office Action from Chinese Patent Application No. 2014800687727 dated Feb. 28, 2020, 4 pgs.

\* cited by examiner

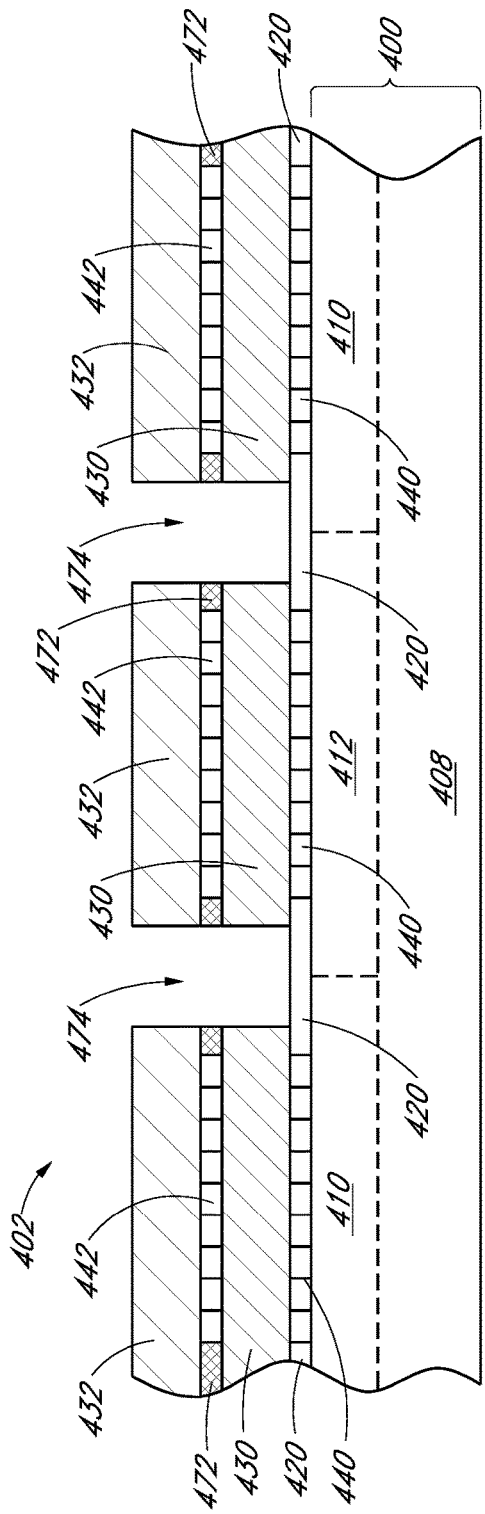
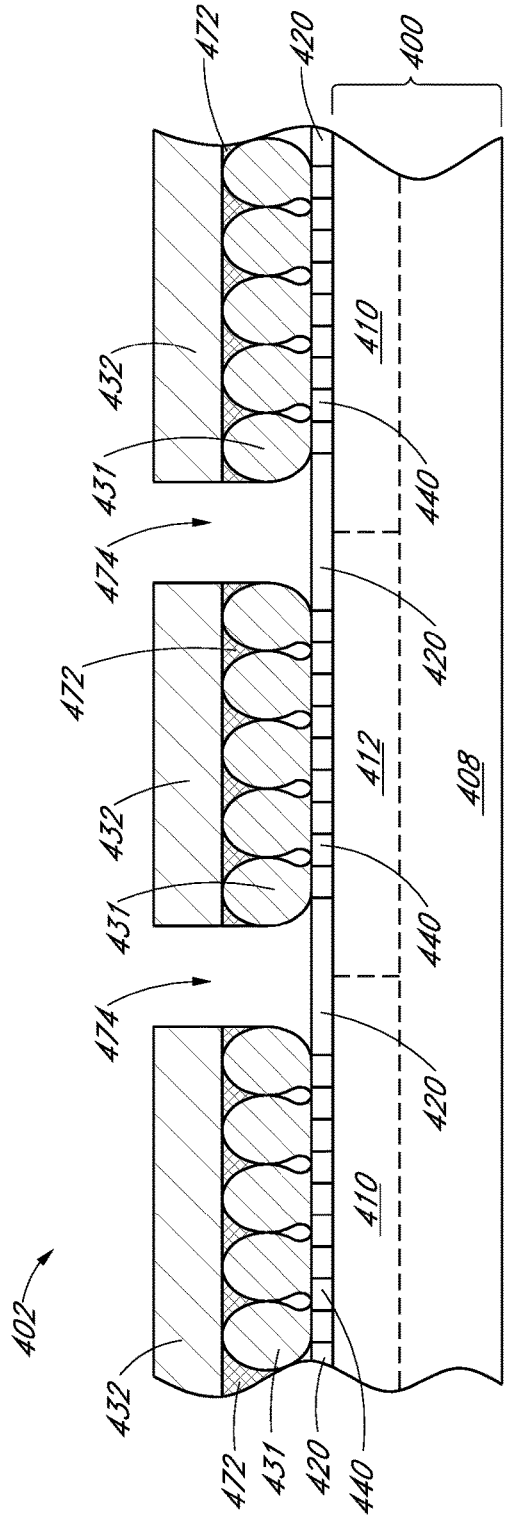

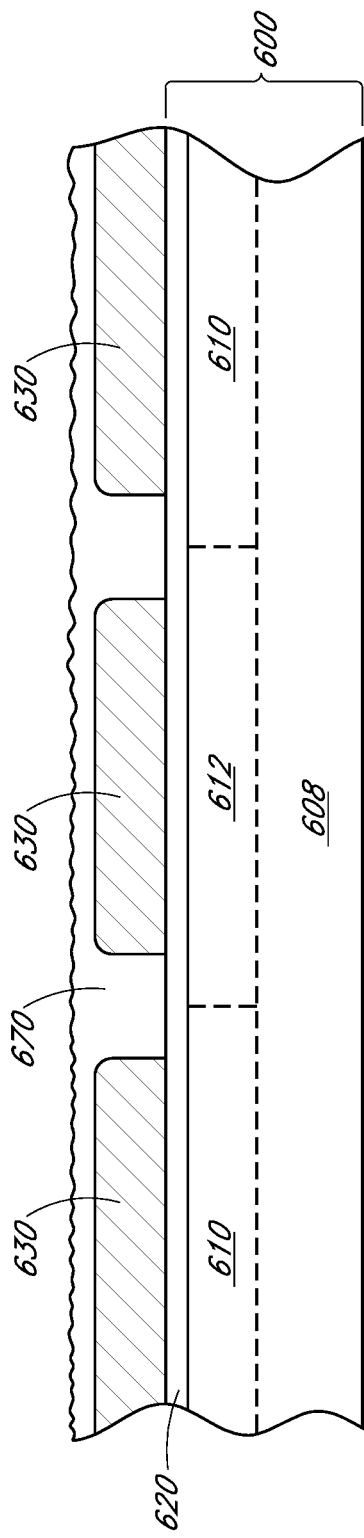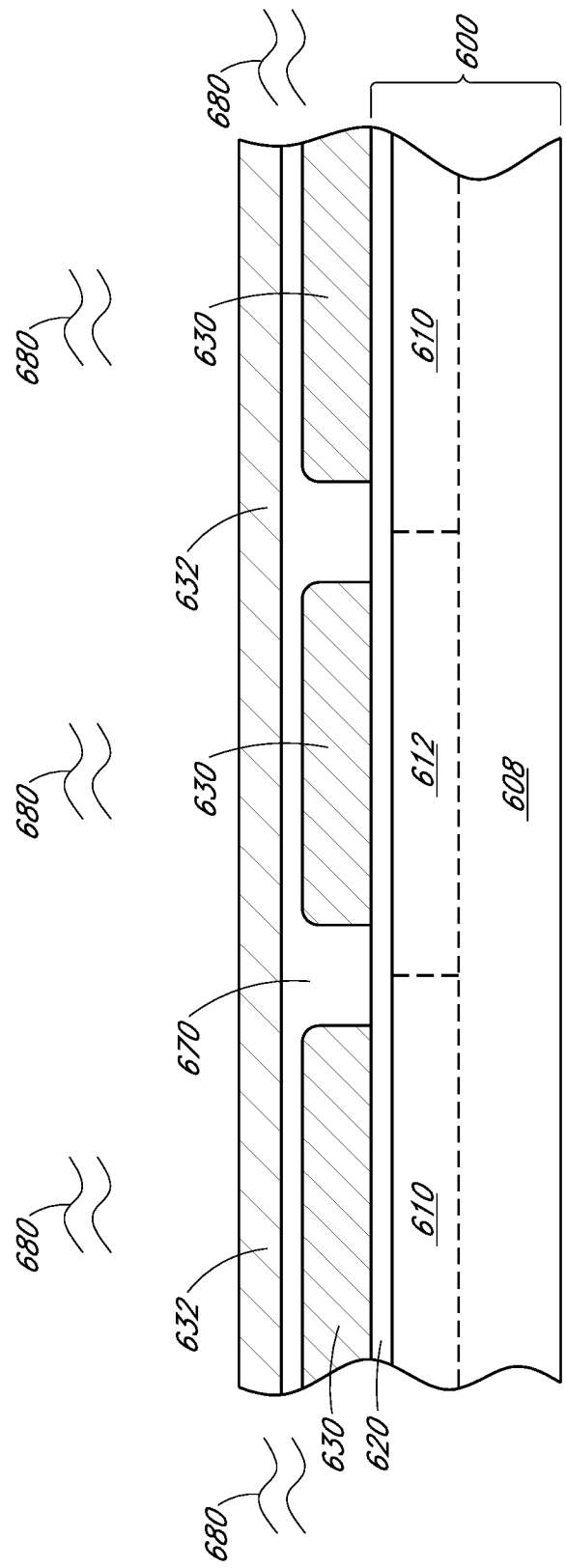

SINGLE-STEP METAL BOND AND CONTACT FORMATION FOR SOLAR CELLS

CROSS-REFERENCE TO RELATED APPLICATIONS

This application is a continuation of U.S. patent application Ser. No. 16/791,951, filed on Feb. 14, 2020, which is a continuation of U.S. patent application Ser. No. 16/167,379, filed on Oct. 22, 2018, now U.S. Pat. No. 10,566,474, issued Feb. 18, 2020, which is a continuation of U.S. patent application Ser. No. 15/436,282, filed on Feb. 17, 2017, now U.S. Pat. No. 10,109,751, issued Oct. 23, 2018, which is a continuation of U.S. patent application Ser. No. 14/874,254, filed on Oct. 2, 2015, now U.S. Pat. No. 9,577,139, issued on Feb. 21, 2017, which is a continuation of U.S. patent application Ser. No. 14/137,918, filed on Dec. 20, 2013, now U.S. Pat. No. 9,178,104, issued on Nov. 3, 2015, the entire contents of which are hereby incorporated by reference herein.

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load. The external electrical circuit may receive electrical current from the solar cell by way of metal fingers that are connected to doped regions of the solar cell.

BRIEF SUMMARY

In an embodiment, a method for fabricating a solar cell is disclosed. The method can include forming a dielectric region on a surface of a solar cell structure. The method can also include forming a first metal layer on the dielectric region. The method can include forming a second metal layer on the first metal layer and locally heating a particular region of the second metal layer, where heating includes forming a metal bond between the first and second metal layer and forming a contact region between the first metal layer and the solar cell structure.

In an embodiment, a method for fabricating a solar cell is disclosed. The method can include forming a dielectric region on a surface of a solar cell structure. The method can also include forming a first metal layer on the dielectric region. The method can include forming an adhesive layer on the first metal layer and forming a second metal layer on the adhesive layer, where the adhesive layer mechanically couples the second metal layer to the first metal layer and allows for an electrical connection between the second metal layer to the first metal layer.

In an embodiment, a solar cell fabricated using any of the above methods is disclosed.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 11 is a cross-section of another example solar cell fabricated according to the disclosed techniques;

FIG. 12 is a cross-section of still another example solar cell fabricated according to the disclosed techniques;

FIG. 14 is a cross-section of an adhesive layer formed on a first metal layer, according to some embodiments;

FIG. 15 is a cross-section of a second metal layer formed on an adhesive layer, according to some embodiments;

DETAILED DESCRIPTION

Figure 1:
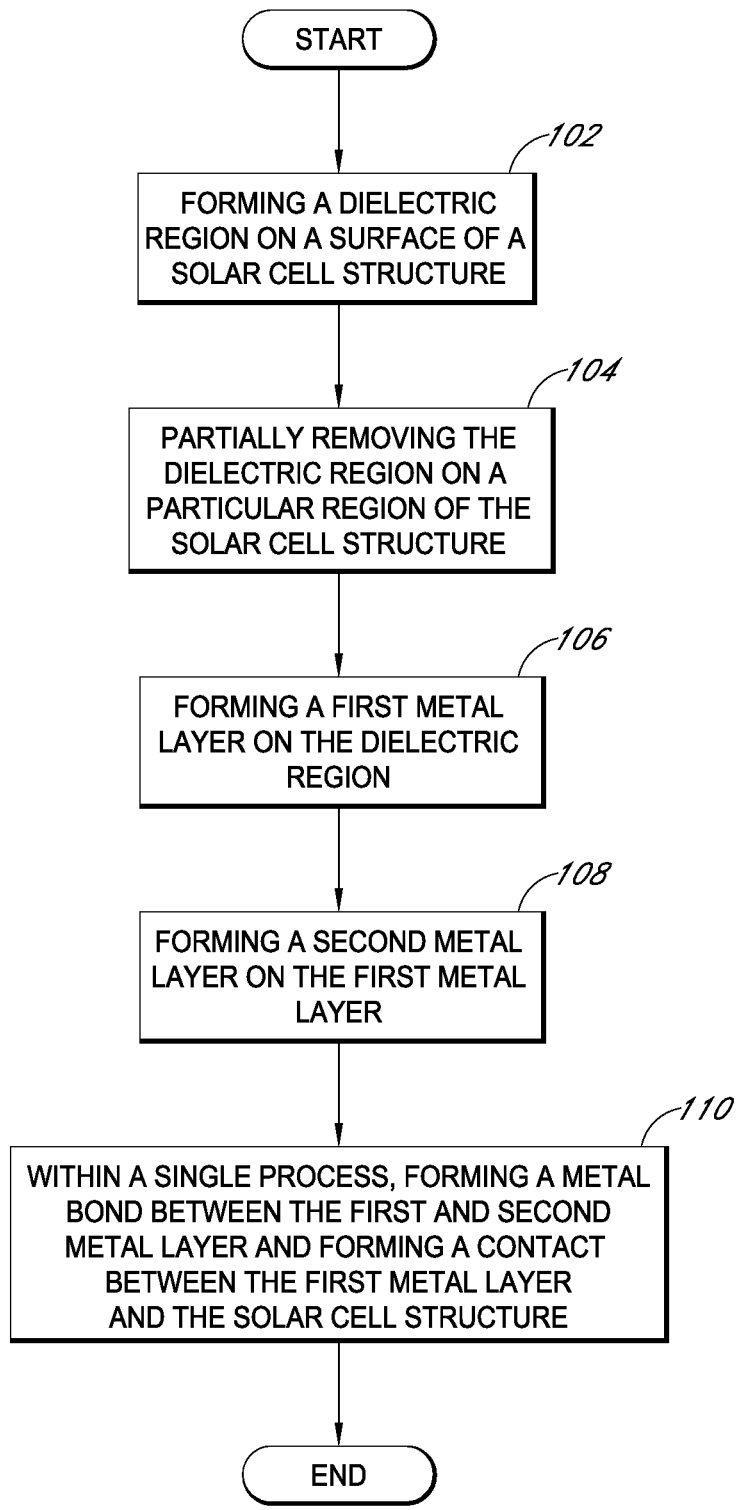
FIG. 1 is a flow chart representation of an example method for fabricating of a solar cell, according to some embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of solar cells for ease of understanding, the disclosed techniques and structures apply equally to other semiconductor structures (e.g., silicon wafers generally).

The formation of metal regions, such as positive and negative busbars and contact fingers to doped regions on a solar cell can be a challenging process. Techniques and structures disclosed herein improve precision throughput and cost for related fabrication processes.

In the present disclosure, numerous specific details are provided, such as examples of structures and methods, to provide a thorough understanding of embodiments. Persons of ordinary skill in the art will recognize, however, that the embodiments can be practiced without one or more of the specific details. In other instances, well-known details are not shown or described to avoid obscuring aspects of the embodiments.

FIG. 1 illustrates a flow chart of an embodiment for an example fabrication method for a solar cell. In various embodiments, the method of FIG. 1 can include additional (or fewer) blocks than illustrated. For example, in one embodiment, partially removing the dielectric region on a particular region, block 104, may not be performed. The method of FIG. 1 can also be performed on a solar cell structure with N-type and P-type doped regions. Note that the method of FIG. 1 can be performed at the cell level during fabrication of the solar cell or at the module level when the solar cell is connected and packaged with other solar cells.

As shown in 102, a dielectric region, which can also be referred to as a dielectric layer, can be formed on a surface of a solar cell structure. In an embodiment, the dielectric region can be formed over an N-type doped region and a P-type doped region of the solar cell structure. In one embodiment, the dielectric region is a continuous and conformal layer that is formed by blanket deposition. In an embodiment, the dielectric region can be formed by screen printing, spin coating, or by deposition and patterning, for example, such that the dielectric region is not continuous. In an embodiment, the dielectric region can include silicon nitride, silicon oxide, silicon oxynitride, aluminum oxide, amorphous silicon or polysilicon.

At 104, the dielectric region can be partially removed to expose/form a contact region. In an embodiment, the contact region can allow for the formation of a contact, such as an ohmic contact. In an embodiment, the dielectric region is partially removed on a particular region, where the particular region is aligned over a N-type doped region or a P-type doped region of the solar cell structure. As mentioned above, note that in some embodiments, block 104 may not be performed and, as a result, the dielectric region may not be partially removed.

At 106, a first metal layer can be formed on the dielectric region. In one embodiment, the first metal layer is a continuous and conformal layer that is formed by blanket deposition. In another embodiment, the first metal layer is non-continuous (e.g., printed in a particular pattern or deposited and then etched into the particular pattern). In an embodiment, forming a metal layer can include performing a physical vapor deposition, screen printing, sintering, plating, or laser transfer process. In an embodiment, the first metal layer can also be referred to as a seed metal layer. In an embodiment, forming the first metal layer can include depositing a seed metal layer on the dielectric region. In an embodiment, the first metal layer can include a metal such as, but not limited to, copper, tin, aluminum, silver, gold, chromium, iron, nickel, zinc, ruthenium, palladium, or platinum and their alloys. In an embodiment, the first metal layer can be a patterned metal layer, such as a first patterned metal layer. In an embodiment, the first patterned metal layer can be placed, deposited or aligned on the dielectric region.

As shown in 108, a second metal layer can be formed on the first metal layer. In one embodiment, the second metal layer is a continuous and conformal layer that is formed by blanket deposition. In an embodiment, the second metal layer can include a metal foil. In an embodiment, the second metal layer can include metal such as, but not limited to, copper, tin, aluminum, silver, gold, chromium, iron, nickel, zinc, ruthenium, palladium, or platinum and their alloys. In an embodiment, the second metal layer can be a patterned metal layer, such as a second patterned metal layer (e.g., a patterned metal foil). In an embodiment, the second patterned metal layer can be placed, deposited or aligned on the dielectric region.

At 110, a metal bond and a contact can be formed in a single process. In an embodiment, forming a metal bond and a contact in a single process includes locally heating a particular region of the second metal layer. In an embodiment, locally heating on a particular region of the second metal layer allows for heat transfer from the second metal layer to a particular region in-between the first and second metal layer and subsequently, the heat further transfers through the first metal layer to a particular region between the first metal layer and the dielectric region forming a contact. In an embodiment, the formed metal bond can electrically and mechanically couple the second metal layer to the first metal layer. In an embodiment, the contact can electrically and mechanically couple the first metal layer to the solar cell structure.

In one embodiment, locally heating includes directing a laser beam on the second metal layer. In an embodiment, directing the laser beam on the second metal layer can weld the second metal layer to the first metal layer. In an embodiment, the laser beam can have a pulse duration in the range of 1 nanosecond to 10 milliseconds. In an embodiment, the laser beam can be generated using a continuous wave (CW) laser or a pulsed laser. In an embodiment, the laser beam has a wavelength in the range of 100 nanometers-12 microns. In an embodiment, the laser beam can be directed on a metal foil, to form a metal bond with a seed metal layer and further form an ohmic contact between the seed metal layer and the solar cell structure. In an embodiment, the metal bond and ohmic contact are aligned with a particular region of the solar cell structure. In an embodiment, the particular region of the solar cell can be aligned to a P-type doped region or an N-type doped region. In an embodiment, the second metal layer or metal foil can be a patterned metal foil (e.g., in a finger pattern, such as an interdigitated finger pattern). In an embodiment, the patterned metal foil can be placed on the seed metal layer. Note that, in some embodiments, non-laser based welding techniques can be used to form the metal bond and contact in a single process. In an embodiment, portions of the first and second metal layer can be removed in an interdigitated pattern prior to locally heating.

The embodiments above can be performed for multiple solar cells. For example, in one embodiment, a metal foil (e.g., corresponding to and/or including contact fingers for multiple cells) can be aligned and placed on a first solar cell and a second solar cell. The metal foil can then be coupled to both a first and second solar cell according to the method of FIG. 1.

FIGS. 2-7 are cross-sectional views that schematically illustrate a method of fabricating a solar cell in accordance with an embodiment of the present disclosure.

Figure 2:
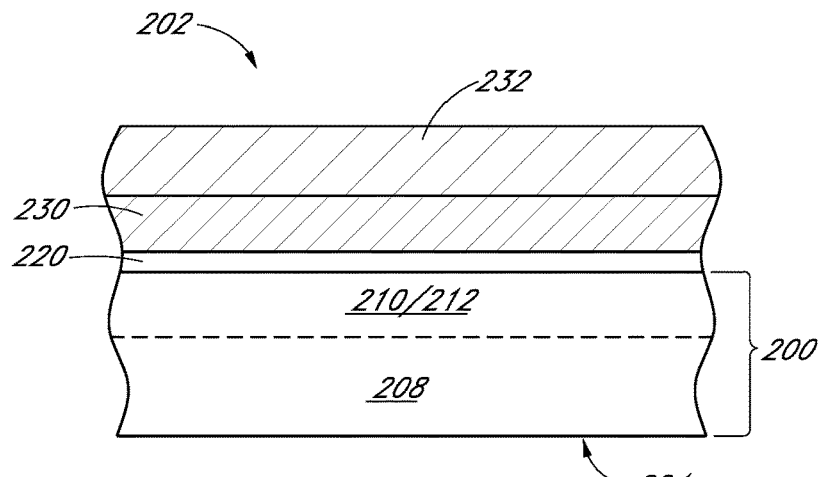
FIG. 2 is a cross-section of a first and second metal layer on a solar cell structure.

With reference to FIG. 2, a solar cell during a fabrication process is shown that includes a second metal layer 232 placed on a first metal layer 230, where the first metal layer 230 is placed on a solar cell structure 200. In an embodiment, the first metal layer 230 can have a thickness in the range of 1-5 microns, for example the first metal layer 230 can be in the range of approximately 1-2 microns. In an embodiment, the second metal layer 232 can have a thickness in the range of 1-100 microns (e.g. a metal foil), for example the second metal layer 232 can be approximately 50 microns. As shown, the solar cell structure 200 can include a silicon substrate 208, a first doped region 210 or a second doped region 212 and a dielectric region 220. The solar cell of FIG. 2 can also include a front side 204, configured to face the sun during normal operation of the solar cell and a back side 202 opposite the front side 204. As discussed above, the first metal layer or second metal layer 230, 232 can include a metal such as, but not limited to, copper, tin, aluminum, silver, gold, chromium, iron, nickel, zinc, ruthenium, palladium, or platinum and their alloys. In an embodiment, the dielectric region 220 can include silicon nitride, silicon oxide, silicon oxynitride, aluminum oxide, amorphous silicon or polysilicon In an embodiment, the first doped region 210 or the second doped region 212 can include a P-type doped region or an N-type doped region of the silicon substrate 208.

Figure 3:
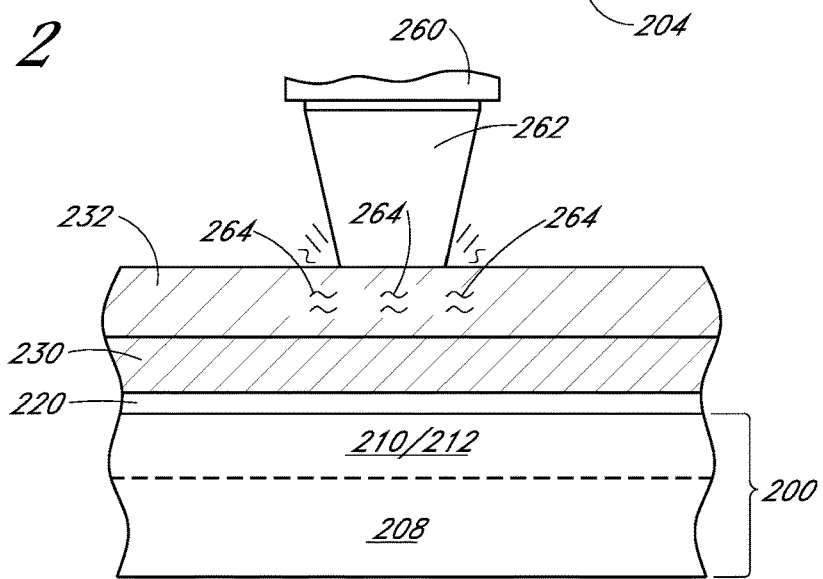
FIG. 3 is a cross-section of locally heating a second metal layer, according to some embodiments.

FIG. 3 illustrates locally heating the second metal layer 232. In an embodiment, locally heating on a particular region of the second metal layer 232 can be performed using a laser beam 262 from a laser source 260. In an embodiment, locally heating can be performed on a particular region of the second metal layer 232 using an electron beam. Subsequently, heat 264 from the laser beam 262 is transferred to the second metal layer 232. In an embodiment, the laser beam 262 can be directed to the second metal layer 232 using a galvanometer, scanning stage or using conventional optical interfacing and control equipment, systems and processes.

Figure 4:
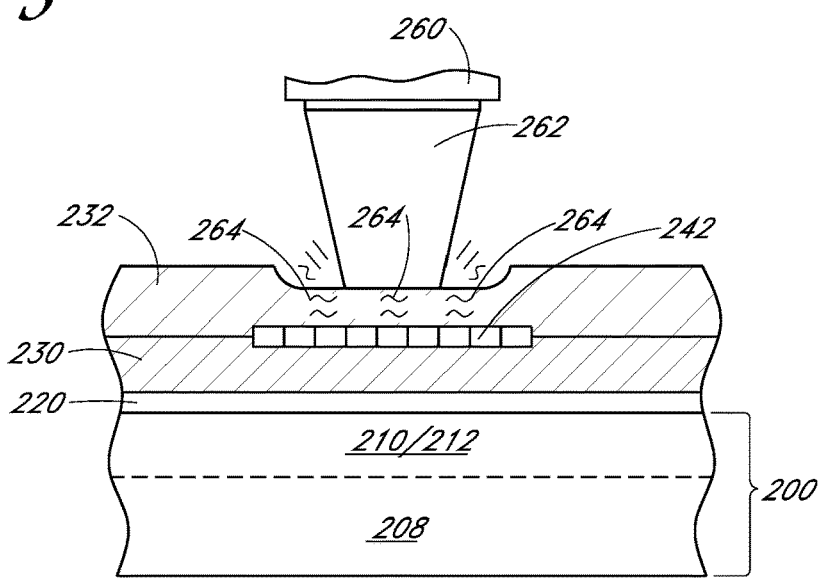
FIG. 4 is a cross-section of forming a metal bond, according to some embodiments.

With reference to FIG. 4, the formation of a metal bond 242 is shown. In an embodiment, heat 264 from the laser beam 262 is transferred through the second metal layer 232 to a region between the first and second metal layer 230, 232 forming a metal bond 242, where the metal bond 242 allows for an electrical connection between the first and second metal layer 230, 232. In an embodiment, the second metal layer can be partially removed or melted due to the heat 264 as shown in FIG. 4. In an embodiment, the metal bond 242 can mechanically couple the second metal layer 232 to the first metal layer 230.

Figure 5:
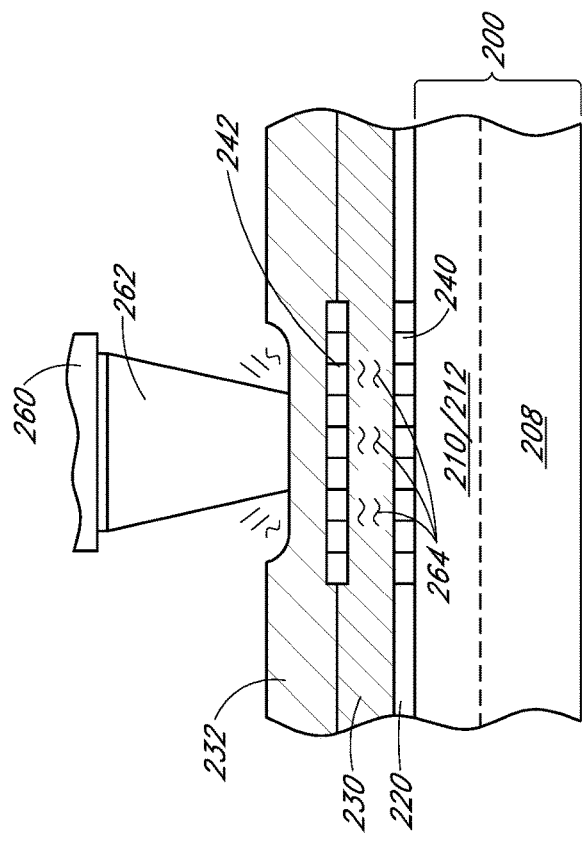
FIG. 5 is a cross-section of forming a contact, according to some embodiments.

FIG. 5 illustrates the formation of a contact 240. In an embodiment, heat 264 from the laser beam 262 is further transferred through the first metal layer 230 to a region between the first metal layer 230 and the doped regions 210, 212, where the heat 264 forms a contact 240, allowing for an electrical connection between the first metal layer 230 and the doped regions 210, 212. As described above, the contact 240 can be an ohmic contact. In an embodiment, the dielectric region 220 may not be dissociated during the above process, allowing for an electrical connection between the first metal layer 230 and the doped regions 210, 212 with the dielectric region 220 between the first metal layer 230 and the doped regions 210, 212 essentially intact (e.g. continuous). In an embodiment, the contact 240 can mechanically couple the first metal layer 230 to the solar cell structure 200.

In an embodiment, the steps shown in FIGS. 3, 4 and 5 can all be performed in single process. In a single process can include changing characteristics of the tool (e.g., laser) used to perform the process. For example, the initial laser pulse can be a higher power pulse to perform one of the bonds followed by a change to a lower power pulse to form the other bond. Laser characteristic/configuration changes other than power can include pulse duration, shape of the pulse, wavelength, etc. In performing the steps of FIGS. 3-5 in a single process, multiple fabrication steps can be removed, i.e. to from a metal bond and an ohmic contact separately, thereby improving solar cell fabrication efficiency and reducing cost.

Figure 6:
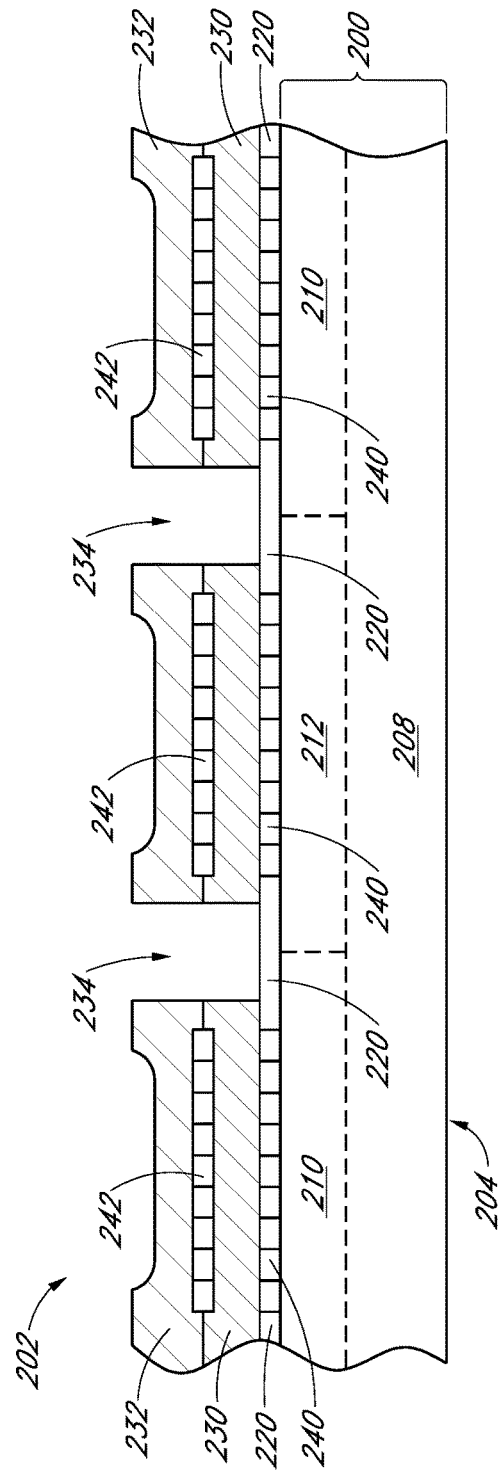
FIG. 6 is a cross-section of an example solar cell fabricated according to the disclosed techniques.

With reference to FIG. 6, a solar cell subsequent to the single-step process performed in FIGS. 3-5 is shown. The solar cell of FIG. 6 can include a front side 204, configured to face the sun during normal operation of the solar cell and a back side 202 opposite the front side. As shown, the solar cell can include a solar cell structure 200. The solar cell 200 structure can include a silicon substrate 208, first and second doped regions 210, 212 and a dielectric region 220. In an embodiment, the dielectric regions 220 can be formed in-between contacts 240. The solar cell structure 200 is coupled to the first metal layer 230 by a contact 240, such as an ohmic contact. In an embodiment, the contact 240 can mechanically couple the first metal layer 230 to the solar cell structure 200. The first metal layer 230 is coupled to the second metal layer 232 by a metal bond 242. In an embodiment, the metal bond 242 can mechanically couple the second metal layer 232 to the first metal layer 230. Contact fingers, made up of the first and second metal layers 230, 232 are separated at separation 234. It is to be noted that an electrical connection at the separation 234 could allow for an electrical short and can be detrimental to the performance of the solar cell. The gap or separation 234 can be formed by a laser ablation process or an etching process, removing excess metal from the first and second metal layers 230, 232. In an embodiment, the first and second doped regions can be P-type and N-type doped regions, respectively. In an embodiment, the dielectric region 220 can be patterned such that some areas do not have dielectric regions under the first metal layer 230. In an embodiment, the first metal layer 230 can have a thickness in the range of 1-5 microns, for example the first metal layer 230 can be in the range of approximately 1-2 microns. In an embodiment, the second metal layer 232 can have a thickness in the range of 1-100 microns (e.g. a metal foil), for example the second metal layer 232 can be approximately 50 microns.

Figure 7:
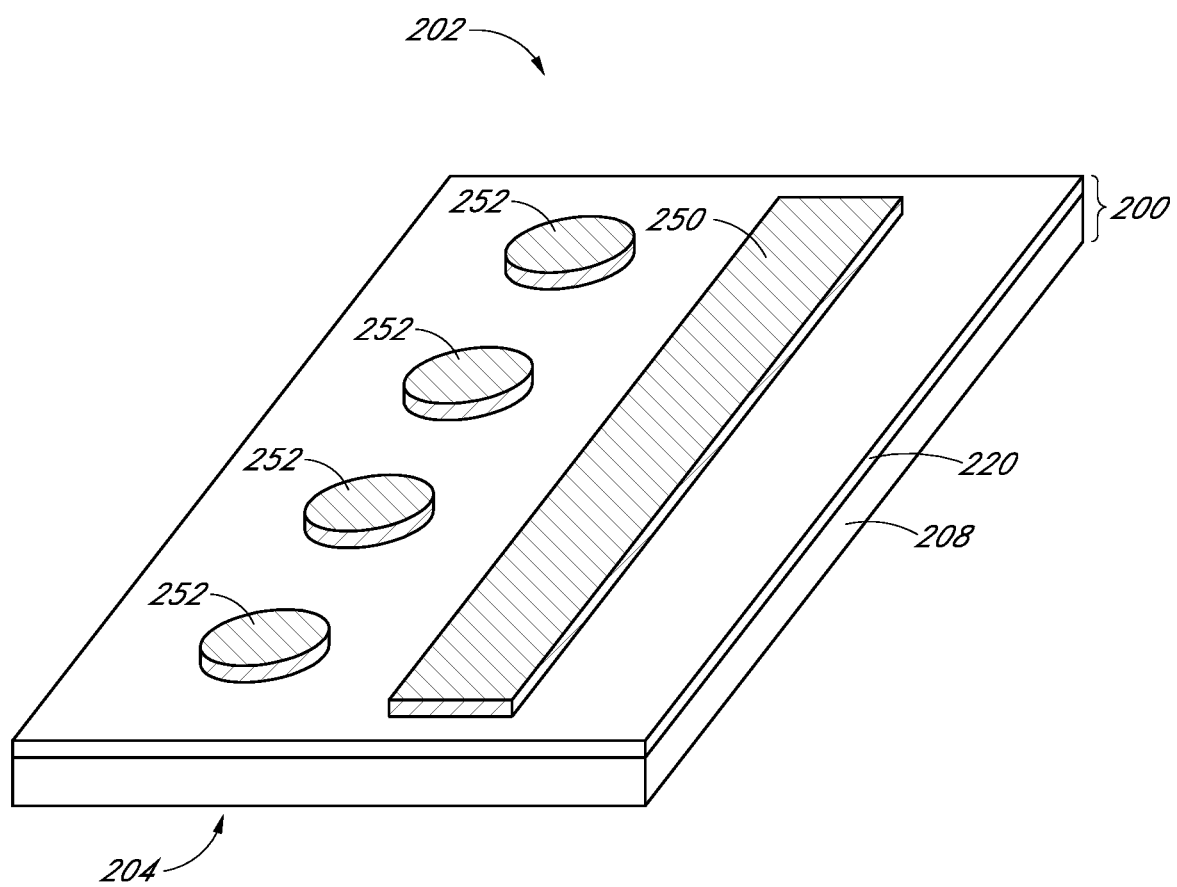
FIG. 7 is a schematic plan view of example for a metal layers, according to some embodiments.

FIG. 7 illustrates example metal layers 250, 252. In an embodiment, the metal layers 230, 232 (from FIGS. 2-6 above) can be formed in a metal strip 250 as shown. In an embodiment, multiple metal strips 250 can be used to from an interdigitated pattern. In an embodiment, the interdigitated pattern can include positive contact fingers, negative contact fingers, positive busbar and a negative busbar. In an embodiment, the metal layers 230, 232 can be formed in round or dotted pattern 252. There is no limitation to the patterns the metal layers 230, 232 can form and FIG. 7 merely illustrates some possible patterns which can be used. The front and back side 204, 202 of the solar cell is shown for reference.

Figure 8:
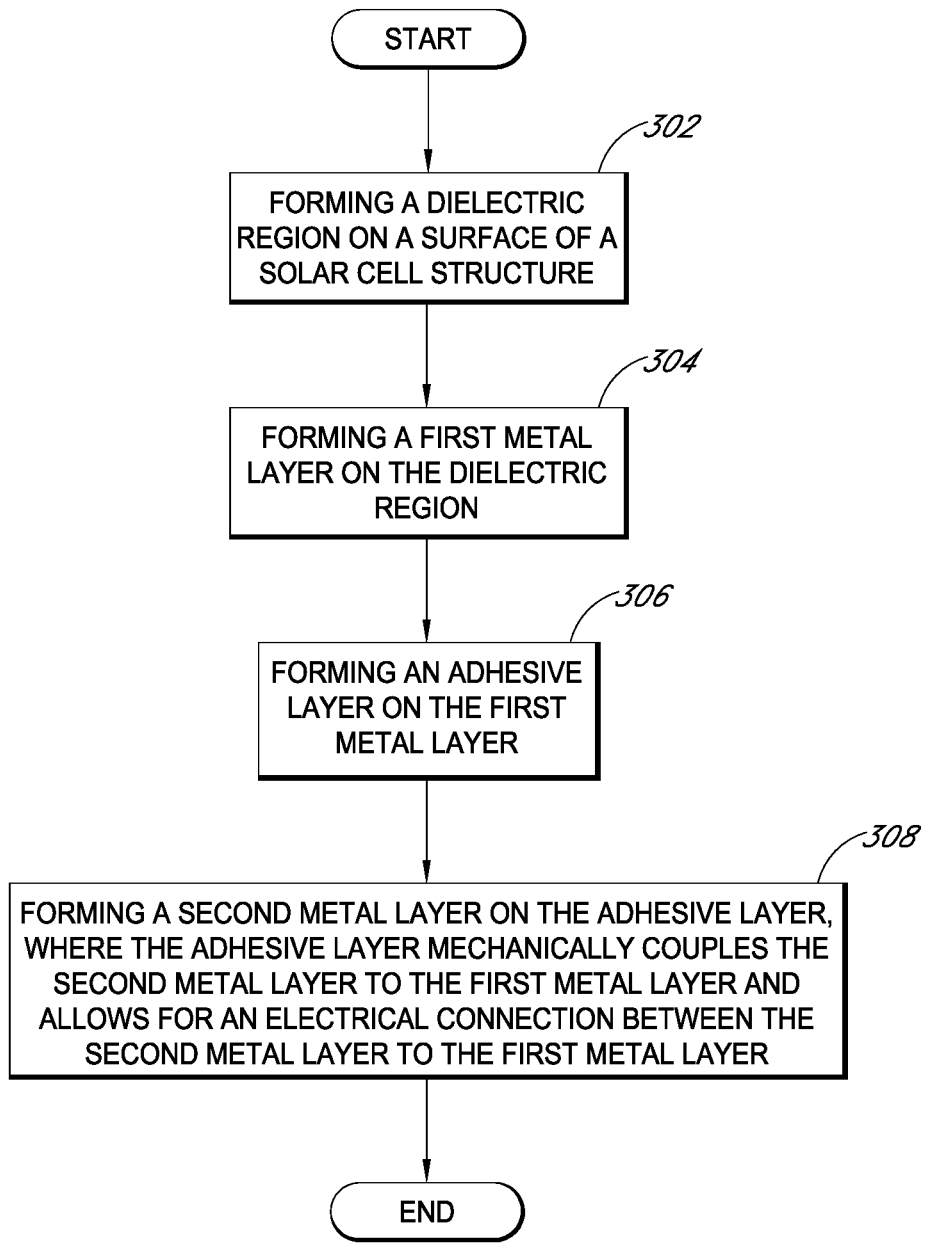
FIG. 8 is a flow chart representation of another example method for fabricating of a solar cell, according to some embodiments.

With reference to FIG. 8, a flow chart of an embodiment for another example fabrication method for a solar cell is shown. In various embodiments, the method of FIG. 8 can include additional (or fewer) blocks than illustrated. The method of FIG. 8 can also be performed on a solar cell structure with N-type and P-type doped regions. Similar to the above, the method of FIG. 8 can be performed at the cell level during fabrication of the solar cell or at the module level when the solar cell is connected and packaged with other solar cells.

As shown in 302, a dielectric region, which can also be referred to as a dielectric layer, can be formed on a surface of a solar cell structure. In an embodiment, the dielectric region can be formed over an N-type doped region and a P-type doped region of the solar cell structure. In one embodiment, the dielectric region is a continuous and conformal layer that is formed by blanket deposition. The dielectric region can be formed by screen printing, spin coating, or by deposition and patterning, for example, such that the dielectric region is not continuous. In an embodiment, the dielectric region can include silicon nitride, silicon oxide, silicon oxynitride, aluminum oxide, amorphous silicon or polysilicon. In an embodiment, the dielectric region can be partially removed to expose/form a contact region. In an embodiment, the contact region can allow for the formation of a contact, such as an ohmic contact. In an embodiment, the dielectric region is partially removed on a particular region, where the particular region is aligned over a N-type doped region or a P-type doped region of the solar cell structure. As mentioned above, note that in some embodiments, the dielectric region may not be partially removed.

At 304, a first metal layer can be formed on the dielectric region. In one embodiment, the first metal layer is a continuous and conformal layer that is formed by blanket deposition. In another embodiment, the first metal layer is non-continuous (e.g., printed in a particular pattern or deposited and then etched into the particular pattern). In an embodiment, forming a metal layer can include performing a physical vapor deposition, screen printing, sintering, plating, or laser transfer process. In an embodiment, the first metal layer can also be referred to as a seed metal layer. In an embodiment, the first metal layer can include a metal foil. In an embodiment, forming the first metal layer can include depositing a seed metal layer on the dielectric region. In an embodiment, the first metal layer can include a metal such as, but not limited to, copper, tin, aluminum, silver, gold, chromium, iron, nickel, zinc, ruthenium, palladium, or platinum and their alloys. In an embodiment, the first metal layer can include a patterned metal layer, such as a first patterned metal layer. In an embodiment, the first patterned metal layer can be placed, deposited or aligned on the dielectric region.

At 306, an adhesive layer can be formed on the first metal layer, and in some embodiments, also on the dielectric region (e.g., filling in gaps between a patterned first metal layer). In an embodiment, the adhesive layer can be formed by screen printing, ink-jet printing, spin coating, casting, lamination or by deposition and patterning, for example. In an embodiment, the adhesive layer can be formed by a Chemical Vapor Deposition (CVD) or a Physical Vapor Deposition (PVD) method. In an embodiment, the adhesive layer can be an insulating adhesive layer. In an embodiment, the adhesive layer can be a uniform low viscosity adhesive layer. In an embodiment, the adhesive layer can be patterned, whether patterned as it is formed, or formed and then patterned (e.g., etched). In an embodiment, forming an adhesive layer can include forming a conductive adhesive layer. In an embodiment, forming an adhesive layer can include forming an anisotropically conductive adhesive layer.

As shown in 308, a second metal layer can be formed on the adhesive layer. In one embodiment, the second metal layer is a continuous and conformal layer that is formed by blanket deposition. In an embodiment, the adhesive layer can provide structural support, mechanically coupling the second metal layer to the first metal layer, and can also allow the second metal layer to be in electrical connection with the first metal layer. In an embodiment, the second metal layer can include a metal foil. In an embodiment, the second metal layer can include metal such as, but not limited to, copper, tin, aluminum, silver, gold, chromium, iron, nickel, zinc, ruthenium, palladium, or platinum and their alloys. In an embodiment, the second metal layer can include a patterned metal layer, such as a second patterned metal layer (e.g., a patterned metal foil). Note that in an embodiment, forming the first metal layer can include any of the blocks described above. Using a patterned adhesive layer can allow for the formation of the second metal layer using a direct physical vapor deposition (PVD) process. In an embodiment, the adhesive layer can be cured subsequent to the formation of the second metal layer. In an embodiment, forming the second metal layer can include forming a metal foil on the adhesive layer. In an embodiment, direct contact between the first and second metal layers can be performed by applying pressure to the second metal layer (e.g., by vacuum, a roller, a squeegee, etc.).

Similar to the above, a metal bond and a contact can be formed. In an embodiment, the metal bond and contact can be formed separately or in a single-step process as discussed above.

The embodiments above can be performed for multiple solar cells. For example, in one embodiment, a metal foil (e.g., including contact fingers for multiple cells) can be aligned and placed on a first solar cell and a second solar cell. The metal foil can then be coupled to both a first and second solar cell. Also, the above can be performed to for various types of solar cells, such as front contact and back contact solar cells.

FIGS. 9-12 are cross-sectional views that schematically illustrate a method of fabricating a solar cell in accordance with an embodiment of the present disclosure. Unless otherwise specified below, the numerical indicators used to refer to components in FIGS. 9-12 are similar to those used to refer to components or features in FIGS. 2-7 above, except that the index has been incremented by 200.

Figure 9:
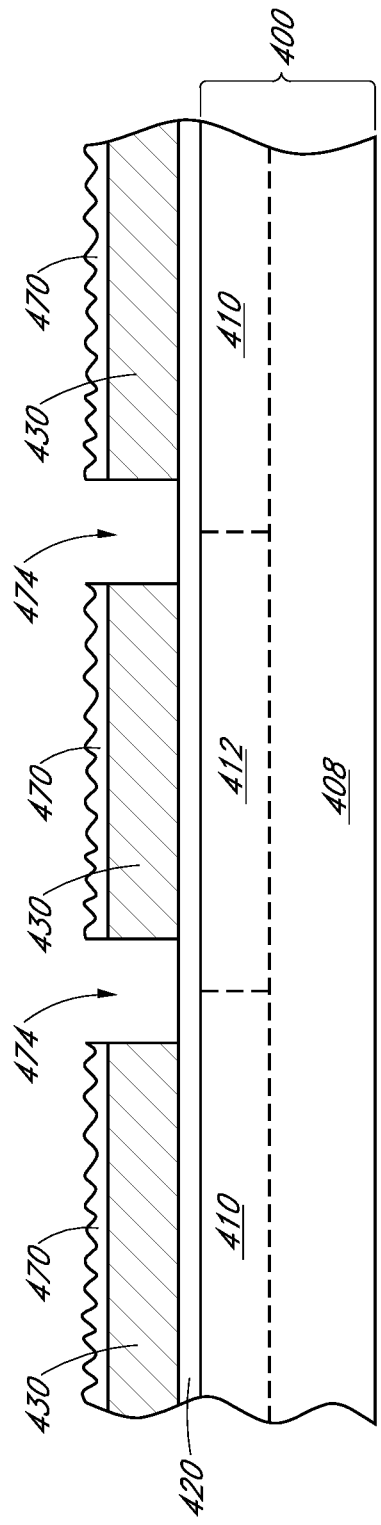
FIG. 9 is a cross-section of an adhesive layer formed on a first metal layer, according to some embodiments.

FIG. 9 illustrates a solar cell during a fabrication process mentioned above. The solar cell of FIG. 9 includes an adhesive layer 470 formed on a first metal layer 430, where the first metal layer 430 is placed on a solar cell structure 400. In an embodiment, the adhesive layer 470 can be formed by screen printing, ink-jet printing, spin coating, casting, lamination or by deposition (CVD or PVD) and patterning. As shown, the solar cell structure 400 can include a silicon substrate 408, a first doped region 410 or a second doped region 412 and a dielectric region 420. In an embodiment, the first metal layer 430 can also be referred to as a seed metal layer. In an embodiment, forming the first metal layer 430 can include depositing a seed metal layer on the dielectric region 420. In an embodiment, the first metal layer 430 can include a metal such as, but not limited to, copper, tin, aluminum, silver, gold, chromium, iron, nickel, zinc, ruthenium, palladium, or platinum and their alloys. In an embodiment, the first metal layer 430 can include a patterned metal layer, such as a first patterned metal layer (e.g., a patterned metal foil). In an embodiment, forming the first metal layer 430 can include placing a patterned metal layer on the dielectric region 420 separated by a gap 474, where the gap 474 can separate positive and negative contact fingers. In an embodiment, a laser ablation process can be performed to form a patterned metal layer. In an embodiment, the gap 474 can be formed through laser ablation or etching. In an embodiment, the dielectric region 420 can include silicon nitride, silicon oxide, silicon oxynitride, aluminum oxide, amorphous silicon or polysilicon. In an embodiment, the first doped region 410 or the second doped region 412 can include a P-type doped region or an N-type doped region of the silicon substrate 408. As mentioned above, the adhesive layer 470 can be an insulating adhesive layer. In an embodiment, the adhesive layer 470 can be a uniform low viscosity adhesive layer. In an embodiment, the adhesive layer 470 can be a patterned adhesive layer. In an embodiment, forming an adhesive layer 470 can include forming an anisotropically conductive adhesive layer.

Figure 10:
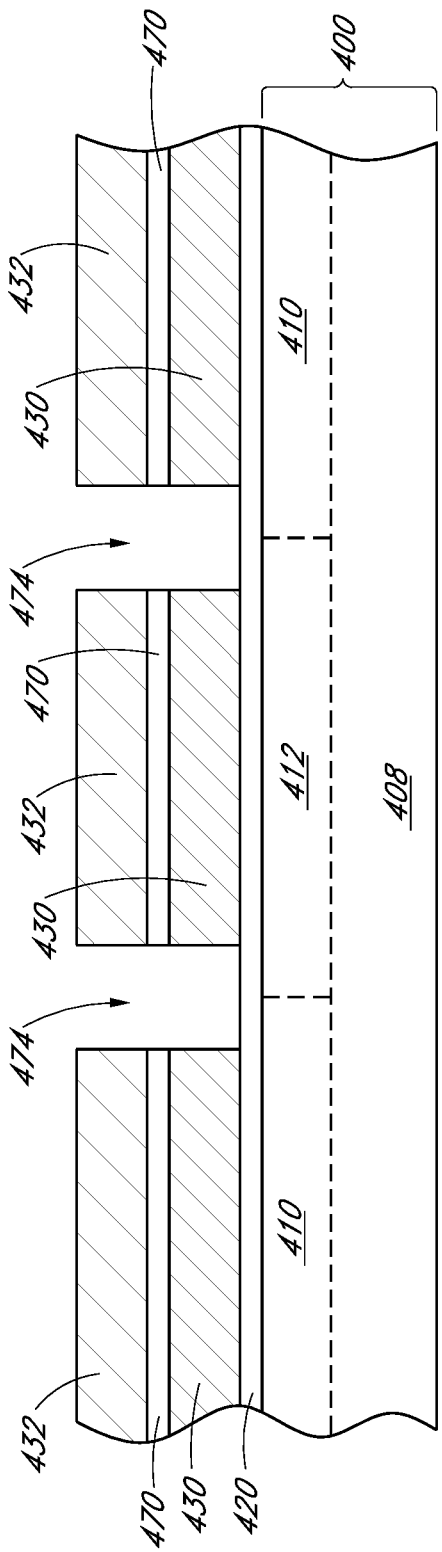
FIG. 10 is a cross-section of a second metal layer formed on an adhesive layer, according to some embodiments.

FIG. 10 illustrates a second metal layer 432 placed on the adhesive layer 470. In an embodiment, the adhesive layer 470 can provide structural support, mechanically coupling the second metal layer 432 to the first metal layer 430. In an embodiment, the second metal layer 432 can include a metal foil. In an embodiment, the second metal layer 432 can include metal such as, but not limited to, copper, tin, aluminum, silver, gold, chromium, iron, nickel, zinc, ruthenium, palladium, or platinum and their alloys. In an embodiment, the second metal layer 432 can include a patterned metal layer, such as a second patterned metal layer. In an embodiment, forming the second metal layer 432 can include placing a patterned metal layer on the adhesive layer 470. In an embodiment, the adhesive layer 470 can be cured subsequent to the formation of the second metal layer 432. In an embodiment, forming the second metal layer 432 can include forming a metal foil on the adhesive layer 470. Provided with a patterned adhesive layer, such as shown at 470 in FIG. 10, an embodiment can include curing the patterned adhesive layer prior to forming a second metal layer 432. In an embodiment, forming a patterned adhesive layer can allow for the formation of the second metal layer 432 using a direct physical vapor deposition (PVD) process. In an embodiment, a patterned adhesive layer can be formed such that openings can be allowed within the patterned adhesive layer for the second metal layer 432 to contact the first metal layer 430, further allowing embodiments, similar to the PVD process discussed, to form the second metal layer 432 on the first metal layer 430. Also a patterned adhesive layer can allow for the second metal layer 432 to be in electrical connection with the first metal layer 430. In an embodiment, the adhesive layer 470 can be cured to form a cured adhesive layer. In an embodiment, forming the second metal layer 432 can include forming a metal foil on the adhesive layer 470. In an embodiment, direct contact between the first and second metal layers 430, 432 can be performed by applying pressure to the second metal layer 432.

With reference to FIG. 11, a solar cell subsequent to the process performed in FIGS. 9 and 10 is shown. The solar cell of FIG. 11 can include a front side 404, configured to face the sun during normal operation of the solar cell and a back side 402 opposite the front side. As shown, the solar cell of FIG. 11 includes a solar cell structure 400. The solar cell 400 structure can include a silicon substrate 408, first and second doped regions 410, 412 and a dielectric region 420. The solar cell structure 400 is coupled to the first metal layer 430 by a contact 440, such as an ohmic contact. In an embodiment, the contact 440 can mechanically couple the first metal layer 430 to the solar cell structure 400. The first metal layer 430 is coupled to the second metal layer 432 by a metal bond 442. In an embodiment, the metal bond 442 can mechanically couple the second metal layer 432 to the first metal layer 430. Contact fingers, made up of the first and second metal layers 430, 432 are separated 474. Any electrical connection at the separation 474 can allow for an electrical short and be detrimental to the performance of the solar cell. The gap or separation 474 can be formed through an etching process or via a laser ablation process where excess metal can be removed from the first and second metal layers 430, 432. In an embodiment, the first and second doped regions 410, 412 can be P-type and N-type doped regions. The solar cell of FIG. 11 includes a metal bond 442 and a contact 440. In an embodiment, the metal bond 442 and the contact 440 can be formed using a laser weld process, either separately or in a single-step process as described above. In an embodiment, the contact 440 can be an ohmic contact. In an embodiment, the metal bond 442 and the contact 440 can be formed using any of the methods described above. In an embodiment, the dielectric region 420 can be patterned such that some areas do not have dielectric regions under the first metal layer 430. In an embodiment, the first metal layer 430 can have a thickness in the range of 1-5 microns, for example the first metal layer 430 can be in the range of approximately 1-2 microns. In an embodiment, the second metal layer 432 can have a thickness in the range of 1-100 microns (e.g. a metal foil), for example the second metal layer 432 can be approximately 50 microns.

FIG. 12 illustrates another solar cell subsequent to the process performed in FIGS. 9 and 10. The solar cell of FIG. 12 can include a front side 404, configured to face the sun during normal operation of the solar cell and a back side 402 opposite the front side. As shown, the solar cell can include a solar cell structure 400. The solar cell 400 structure can include a silicon substrate 408, first and second doped regions 410, 412 and a dielectric region 420. In one embodiment, the first metal layer 431 is composed of a plurality of metal particles. In an embodiment, the plurality of metal particles includes aluminum particles. In an embodiment, the solar cell structure 400 can be coupled to the first metal layer 431 by a contact 440, such as an ohmic contact. In an embodiment, the contact 440 can mechanically couple the first metal layer 431 to the solar cell structure 400. In one embodiment, the first metal layer 431 is in electrical connection with the second metal layer 432, where the adhesive layer, such as a cured adhesive layer 472, allows for the electrical connection without a metal bond or weld. In an embodiment, the adhesive layer 472 can mechanically couple the second metal layer 432 to the first metal layer 430. Contact fingers, made up of the first and second metal layers 430, 432 are separated 474. Any electrical connection at the separation 474 can allow for an electrical short and be detrimental to the performance of the solar cell. The gap or separation 474 can be formed by a laser ablation process or by etching, removing excess metal from the first and second metal layers 430, 432. In an embodiment, the first and second doped regions 410, 412 can be P-type and N-type doped regions, respectively. In an embodiment, the dielectric region 420 can be patterned such that some areas do not have dielectric regions under the first metal layer 430. In an embodiment, the first metal layer 431 can have a thickness in the range of 1-5 microns, for example the first metal layer 431 can be in the range of approximately 1-2 microns. In an embodiment, the second metal layer 432 can have a thickness in the range of 1-100 microns (e.g. a metal foil), for example the second metal layer 432 can be approximately 50 microns.

Note that while the example of FIGS. 9-12 illustrate the first metal layer being patterned before forming the second metal layer on top of the adhesive layer and first metal layer, in other embodiments, the second metal layer can be formed on top of the adhesive layer and first metal layer. In various embodiments, patterning can take place after forming the first metal layer, after forming the first metal layer and adhesive layer, after forming all three layers, or at multiple stages in the process (e.g., after forming the first metal layer, and then also after forming the adhesive and second metal layers).

Figure 13:
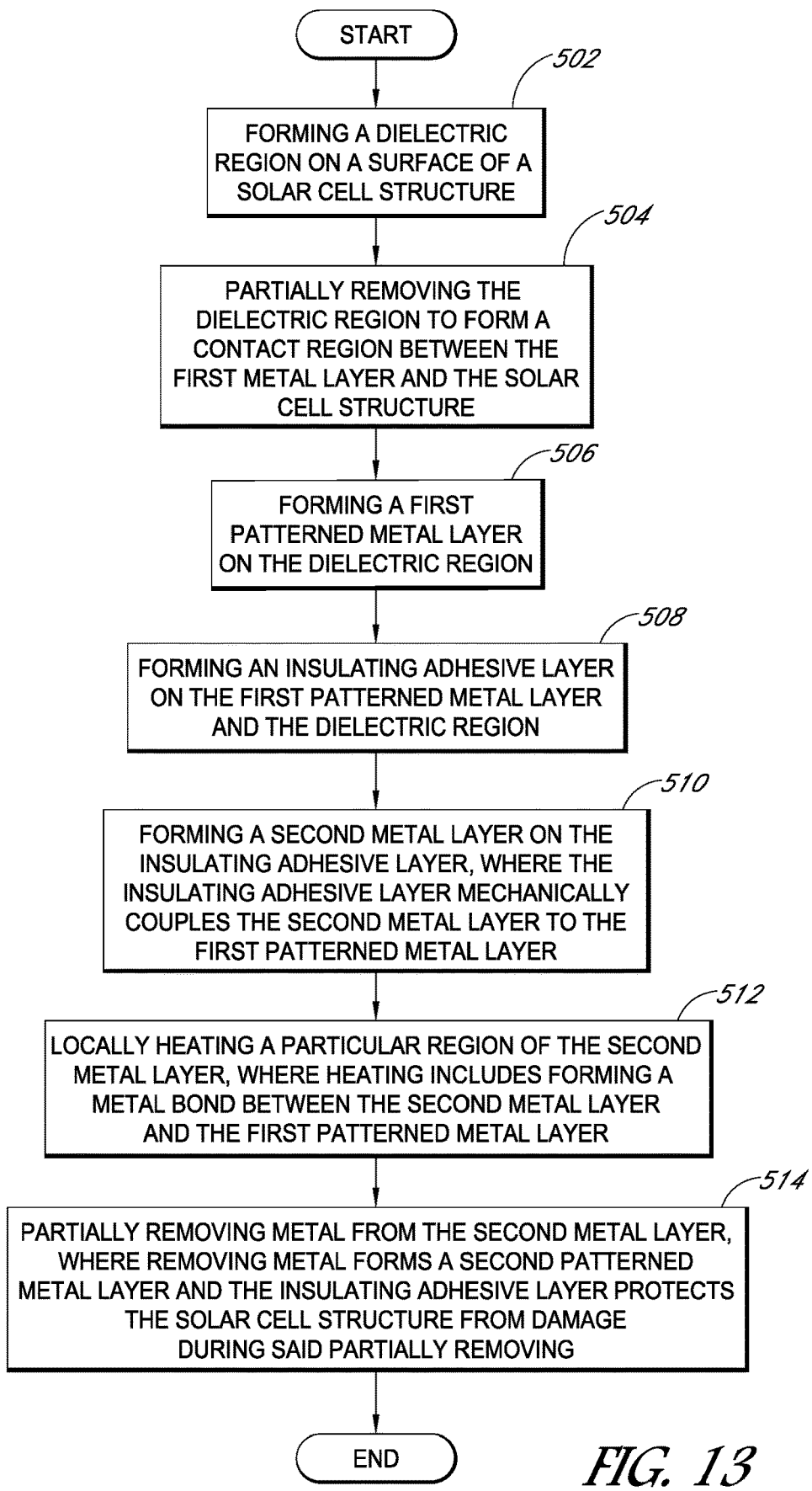
FIG. 13 is a flow chart representation of still another an example method for fabricating of a solar cell, according to some embodiments.

With reference to FIG. 13, a flow chart of an embodiment for still another example fabrication method for a solar cell is shown. In various embodiments, the method of FIG. 13 can include additional (or fewer) blocks than illustrated. For example, in one embodiment, partially removing the dielectric region, block 504, need not be performed. The method of FIG. 13 can also be performed on a solar cell structure with N-type and P-type doped regions. Similar to the above, the method of FIG. 13 can be performed at the cell level during fabrication of the solar cell or at the module level when the solar cell is connected and packaged with other solar cells.

As shown in 502, a dielectric region, which can also be referred to as a dielectric layer, can be formed on a surface of a solar cell structure. In an embodiment, the dielectric region can be formed over an N-type doped region and a P-type doped region of the solar cell structure. In one embodiment, the dielectric region is a continuous and conformal layer that is formed by blanket deposition. The dielectric region can be formed by any of the methods described above such as screen printing, spin coating, or by deposition and patterning for example, such that the dielectric region is not continuous. In an embodiment, the dielectric region can include silicon nitride, silicon oxide, silicon oxynitride, aluminum oxide, amorphous silicon or polysilicon. In an embodiment, the dielectric region can be partially removed from the dielectric region forming a contact region. In an embodiment, the contact region can allow for the formation of a contact, such as an ohmic contact.

At 504, the dielectric region can be partially removed to expose/from a contact region. In an embodiment, the contact region can allow for the formation of a contact, such as an ohmic contact. In an embodiment, the dielectric region is partially removed on a particular region, where the particular region is aligned over a N-type doped region or a P-type doped region of the solar cell structure. As mentioned above, note that in some embodiments, block 504 may not be performed and, as a result, the dielectric region may not be partially removed.

At 506, a first metal layer can be formed on the dielectric region. In an embodiment, the first metal layer is a first patterned metal layer, and the first patterned metal layer can be placed on the dielectric region. Note that, in one embodiment, the metal layer can be patterned after it is applied/formed whereas in other embodiments, the metal layer can be applied in a particular pattern. In one embodiment, the first metal layer is a continuous and conformal layer that is formed by blanket deposition. In an embodiment, forming a metal layer can include performing a physical vapor deposition, screen printing, sintering, plating, or laser transfer process. In an embodiment, the first metal layer can also be referred to as a seed metal layer. In an embodiment, forming the first metal layer can include depositing a seed metal layer on the dielectric region. In an embodiment, the first metal layer can include a metal such as, but not limited to, copper, tin, aluminum, silver, gold, chromium, iron, nickel, zinc, ruthenium, palladium, or platinum and their alloys. In an embodiment, a laser ablation process or etching can be performed to form the first patterned metal layer.

At 508, an adhesive layer can be formed on the first metal layer and on the dielectric region. In an embodiment, the adhesive layer can be an insulating adhesive layer. In an embodiment, the adhesive layer can be formed by screen printing, ink-jet printing, spin coating, casting, lamination or by deposition and patterning, for example. In an embodiment, the adhesive layer can be formed by a Chemical Vapor Deposition (CVD) or a Physical Vapor Deposition (PVD) method. In an embodiment, the adhesive layer can be a uniform low viscosity adhesive layer. In an embodiment, the adhesive layer can be a patterned adhesive layer. In an embodiment, forming an adhesive layer can include forming a conductive adhesive layer. In an embodiment, forming an adhesive layer can include forming an anisotropically conductive adhesive layer. In an embodiment, the adhesive layer can provide additional structural support, such as mechanically coupling the second metal layer to the first metal layer.

As shown in 510, a second metal layer can be formed on the adhesive layer. In an embodiment, the adhesive layer can provide structural support, mechanically coupling the second metal layer to the first metal layer. In one embodiment, the second metal layer is a continuous and conformal layer that is formed by blanket deposition. In an embodiment, the second metal layer can include a metal foil. In an embodiment, the second metal layer can include metal such as, but not limited to, copper, tin, aluminum, silver, gold, chromium, iron, nickel, zinc, ruthenium, palladium, or platinum and their alloys. In an embodiment, the adhesive layer can be cured subsequent to the formation of the second metal layer. In an embodiment, forming the second metal layer can include forming a metal foil on the adhesive layer.

At 512, a metal bond and a contact can be formed by locally heating a particular region on the second metal layer. In an embodiment, locally heating a particular region of the second metal layer allows for heat transfer from the second metal layer to a particular region in-between the first and second metal layer forming the metal bond. Subsequently, the heat can further transfer through the first metal layer to a particular region between the first metal layer and the dielectric region forming a contact. In an embodiment, locally heating includes directing a laser beam on the second metal layer. In an embodiment, any of the methods described above can be used to from the metal bond and contact, either separately or in a single-step process. In an embodiment, the formed metal bond can electrically and mechanically couple the second metal layer to the first metal layer. In an embodiment, the contact can electrically and mechanically couple the first metal layer to the solar cell structure.

At 514, metal from the second metal layer can be partially removed to form a second patterned metal layer. In an embodiment, the adhesive layer, or insulating adhesive layer, protects the solar cell structure from damage during the said partially removing process. In an embodiment, a laser ablation process can be used to remove excess metal from the second metal layer. In an embodiment, the adhesive layer absorbs excess laser radiation from the laser beam, protecting the dielectric region and solar cell structure from damage. In an embodiment, the adhesive layer can be a heat insulation layer, from laser damage, and an electrical insulation layer, between the first and second metal layers. In an embodiment, an etching process can be used to remove excess metal.

The embodiments above can be performed for multiple solar cells. For example, in one embodiment, a metal foil (e.g., including contact fingers for multiple cells) can be aligned and placed on a first solar cell and a second solar cell. The metal foil can then be coupled to both a first and second solar cell. Also, the above can be performed to for various types of solar cells, such as front contact and back contact solar cells.

FIGS. 14-19 are cross-sectional views that schematically illustrate a method of fabricating a solar cell in accordance with an embodiment of the present disclosure. Unless otherwise specified below, the numerical indicators used to refer to components in FIGS. 14-19 are similar to those used to refer to components or features in FIGS. 9-12 above, except that the index has been incremented by 200.

FIG. 14 illustrates a solar cell during a fabrication process mentioned above. The solar cell of FIG. 14 includes an adhesive layer 670 formed on a first metal layer 630 and the dielectric region 620, where the first metal layer 630 is placed on a solar cell structure 600. In an embodiment, the adhesive layer 670 can be formed by screen printing, ink-jet printing, spin coating, casting, lamination or by deposition (CVD or PVD) and patterning. As shown, the solar cell structure 600 can include a silicon substrate 608, a first doped region 610 or a second doped region 612 and a dielectric region 620. In an embodiment, the first metal layer 630 can also be referred to as a seed metal layer. In an embodiment, forming the first metal layer 630 can include depositing a seed metal layer on the dielectric region 620. In an embodiment, the first metal layer 630 can include a metal such as, but not limited to, copper, tin, aluminum, silver, gold, chromium, iron, nickel, zinc, ruthenium, palladium, or platinum and their alloys. In an embodiment, the first metal layer 630 can include a patterned metal layer, such as a first patterned metal layer. In an embodiment, forming the first metal layer 630 can include placing a patterned metal layer on the dielectric region 620. In an embodiment, a laser ablation process can be performed to form a patterned metal layer. In an embodiment, the dielectric region 620 can include silicon nitride, silicon oxide, silicon oxynitride, aluminum oxide, amorphous silicon or polysilicon. In an embodiment, the first doped region 610 or the second doped region 612 can include a P-type doped region or an N-type doped region of the silicon substrate 608. As mentioned above, the adhesive layer 670 can be an insulating adhesive layer. In an embodiment, the adhesive layer 670 can be a uniform low viscosity adhesive layer. In an embodiment, forming an adhesive layer 670 can include forming an anisotropically conductive adhesive layer.

Figure 16:
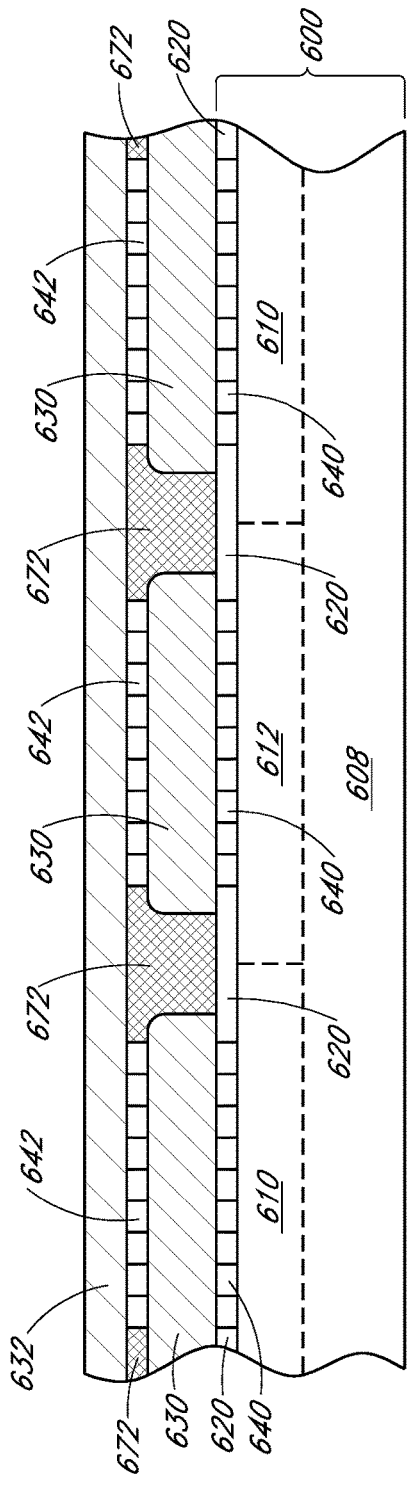
FIG. 16 is a cross-section of metal bonds, contacts and a cured adhesive layer, according to some embodiments.

With reference to FIG. 15, a second metal layer 632 placed on the adhesive layer 670 is shown. In an embodiment, the adhesive layer 670 can provide structural support, mechanically coupling the second metal layer 632 to the first metal layer 630. In an embodiment, the second metal layer 632 can include a metal foil. In an embodiment, the second metal layer 632 can include metal such as, but not limited to, copper, tin, aluminum, silver, gold, chromium, iron, nickel, zinc, ruthenium, palladium, or platinum and their alloys. In an embodiment, the adhesive layer 670 can be cured 680 subsequent to the formation of the second metal layer 632. In an embodiment, curing can include heating the adhesive layer 670. In an embodiment, the curing can form a cured adhesive layer 672 as shown in FIG. 16. In an embodiment, forming the second metal layer 632 can include forming a metal foil on the adhesive layer 670. In an embodiment, direct contact between the first and second metal layers 630, 632 can be performed by applying pressure to the second metal layer 632.

FIG. 16 illustrates a cured adhesive layer 672, a metal bond 642 and a contact 640. In an embodiment, the metal bond 642 and a contact 640 can be formed separately or in a single-step process as discussed above.

Figure 17:
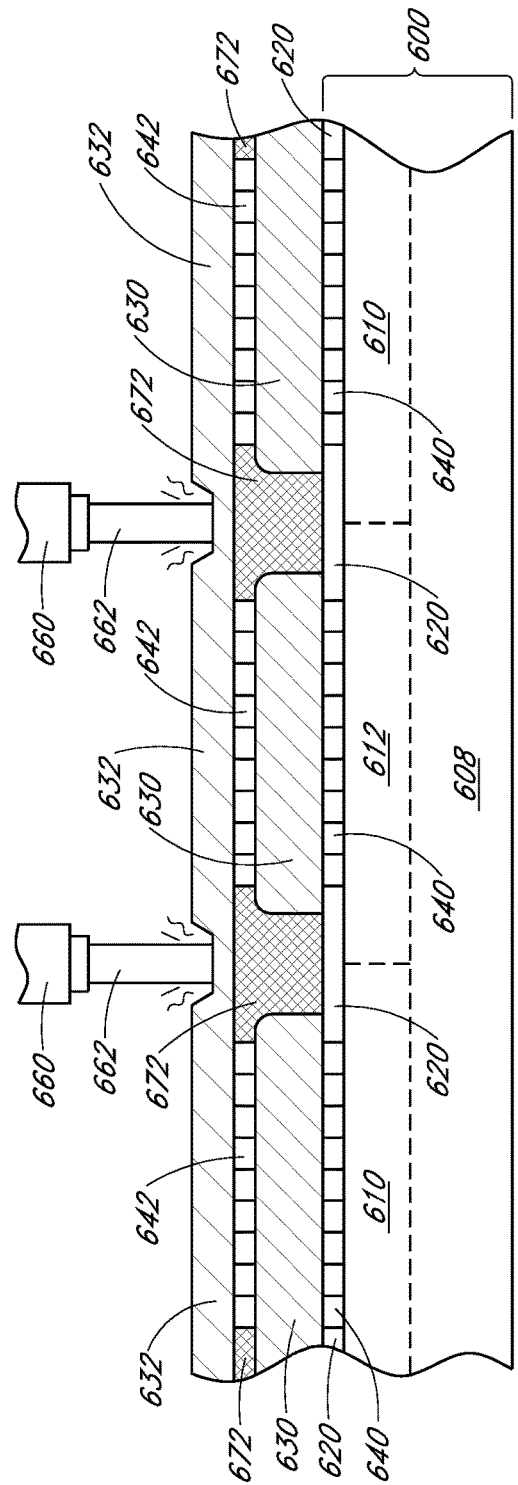
FIG. 17 is a cross-section of forming a patterned metal layer, according to some embodiments.

With reference to FIG. 17, metal from the second metal layer 632 can be partially removed to form a second patterned metal layer. In an embodiment, the adhesive layer, cured adhesive layer 672, or insulating adhesive layer, protects the solar cell structure 600 from damage during the said process of partially removing the second metal layer 632. In an embodiment, a laser ablation process can be used to remove excess metal from the second metal layer 632. In an embodiment, the adhesive layer or cured adhesive layer 672 absorbs excess laser radiation from a laser beam 662 from a laser source 660, protecting the dielectric region 620 and solar cell structure 600 from damage. In an embodiment, the adhesive layer can be a heat insulation layer, from i.e. laser damage as shown, and an electrical insulation layer.

Figure 18:
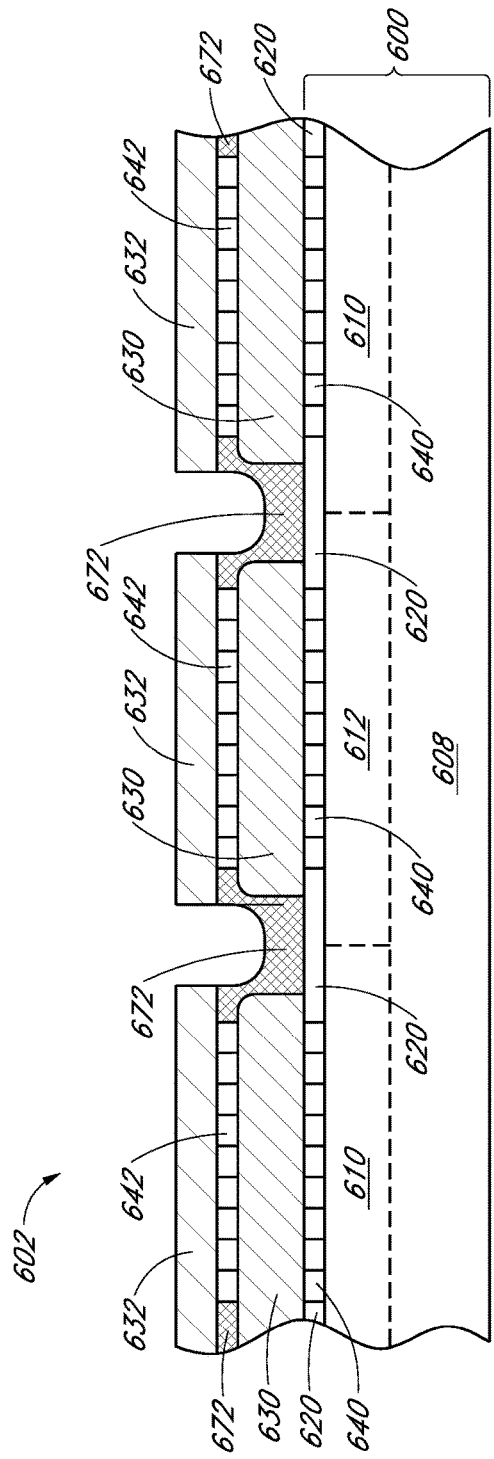
FIG. 18 is a cross-section of an example solar cell fabricated according to the disclosed techniques.

FIG. 18 illustrates a solar cell subsequent to the process performed in FIGS. 14-17. The solar cell of FIG. 18 can include a front side 604, configured to face the sun during normal operation of the solar cell and a back side 602 opposite the front side. As shown, the solar cell of FIG. 18 includes a solar cell structure 600. The solar cell 600 structure can include a silicon substrate 608, first and second doped regions 610, 612 and a dielectric region 620. The solar cell structure 600 is coupled to the first metal layer 630 by a contact 640, such as an ohmic contact. In an embodiment, the contact 640 can mechanically couple the first metal layer 630 to the solar cell structure 600. The first metal layer 630 is coupled to the second metal layer 632 by a metal bond 642. In an embodiment, the metal bond 642 can mechanically couple the second metal layer 632 to the first metal layer 630. Contact fingers, made up of the first and second metal layers 630, 632 are separated. The adhesive layer, such as a cured adhesive layer 672, can be between contact fingers and electrically insulating contact fingers of opposite polarity. In an embodiment, the first and second doped regions 610, 612 can be P-type and N-type doped regions. The solar cell of FIG. 18 includes a metal bond 642 and a contact 640. In an embodiment the metal bond 642 and the contact 440 can be formed using a laser weld process, either separately or in a single-step process as described above. In an embodiment, the contact 640 can be an ohmic contact. In an embodiment, the dielectric region 620 can be patterned such that some areas do not have dielectric regions under the first metal layer 630. In an embodiment, the first metal layer 630 can have a thickness in the range of 1-5 microns, for example the first metal layer 630 can be in the range of approximately 1-2 microns. In an embodiment, the second metal layer 632 can have a thickness in the range of 1-100 microns (e.g. a metal foil), for example the second metal layer 632 can be approximately 50 microns.

Figure 19:
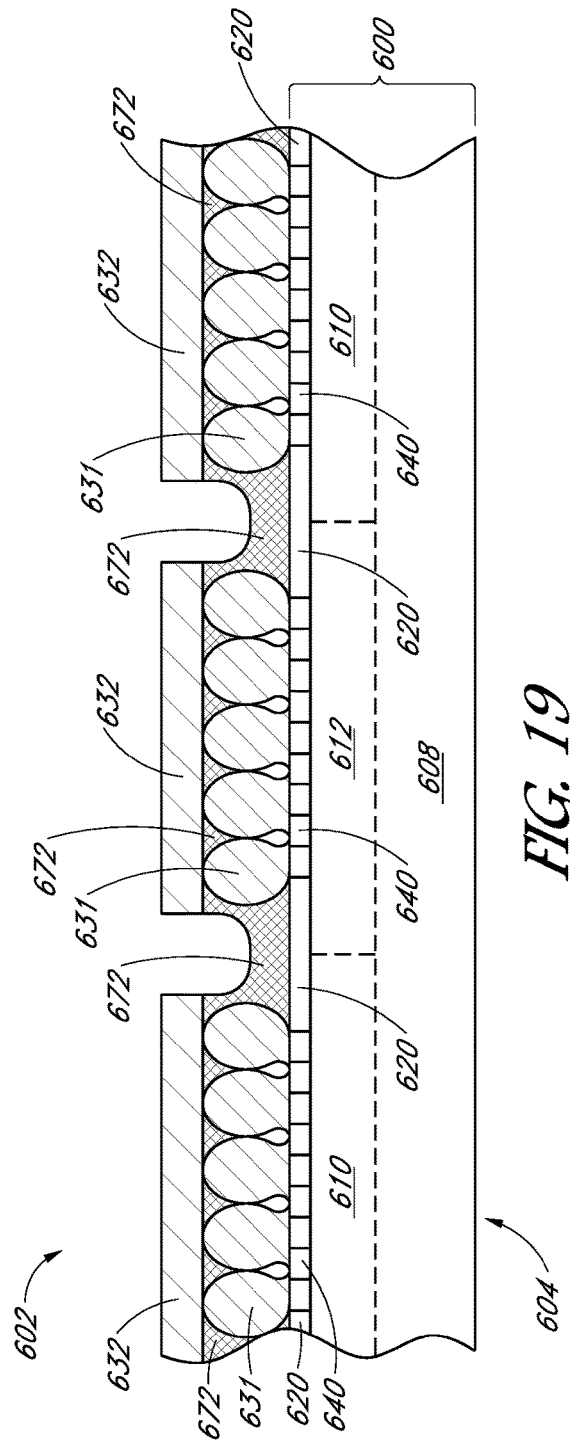
FIG. 19 is a cross-section of still another example solar cell fabricated according to the disclosed techniques.

With reference to FIG. 19, another solar cell subsequent to the process performed in FIGS. 14-17 is shown. The solar cell of FIG. 19 can include a front side 604, configured to face the sun during normal operation of the solar cell and a back side 602 opposite the front side. As shown, the solar cell can include a solar cell structure 600. The solar cell 600 structure can include a silicon substrate 608, first and second doped regions 610, 612 and a dielectric region 620. In one embodiment, the first metal layer 631 is composed of a plurality of metal particles. In an embodiment, the plurality of metal particles can include aluminum particles. In an embodiment, the solar cell structure 600 can be coupled to the first metal layer 631 by a contact 640, such as an ohmic contact. In an embodiment, the contact 640 can mechanically couple the first metal layer 630 to the solar cell structure 600. In one embodiment, the first metal layer 631 is in electrical connection with the second metal layer 632, where the adhesive layer, such as a cured adhesive layer 672, allows for the electrical connection without a metal bond or weld. In an embodiment, the adhesive layer can mechanically couple the second metal layer 632 to the first metal layer 630. Contact fingers, made up of the first and second metal layers 630, 632 are separated. The adhesive layer, such as a cured adhesive layer 672, can be electrically insulate contact fingers of opposite polarity. In an embodiment, the first and second doped regions 610, 612 can be P-type and N-type doped regions. In an embodiment, the dielectric region 620 can be patterned such that some areas do not have dielectric regions under the first metal layer 631. In an embodiment, the first metal layer 631 can have a thickness in the range of 1-5 microns, for example the first metal layer 631 can be in the range of approximately 1-2 microns. In an embodiment, the second metal layer 632 can have a thickness in the range of 1-100 microns (e.g. a metal foil), for example the second metal layer 632 can be approximately 50 microns.

The embodiments above can be performed for multiple solar cells (e.g., including contact fingers for multiple cells). Also, the above can be performed to for various types of solar cells, such as front contact and back contact solar cells.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar cell, comprising:
   a dielectric contact layer including a plurality of alternating dielectric regions and first converted contact regions, the dielectric contact layer over a first doped region of the solar cell, wherein the first converted contact regions include a dielectric that has been converted to be conductive; and
   a first metal layer disposed on the dielectric contact layer, wherein the dielectric contact layer is continuous between the first metal layer and the first doped region, and the first doped region and the first converted contact regions form an ohmic contact between the first metal layer and the first doped region, and wherein the first metal layer comprises a plurality of discrete discontinuous portions, individual ones of the plurality of discrete discontinuous portions on a corresponding one of the first converted contact regions.

2. The solar cell of claim 1, wherein the converted contact regions are separated by the dielectric regions.

3. The solar cell of claim 1, further comprising a second doped region, wherein the dielectric contact layer is formed over the second doped region such that second converted contact regions of the dielectric contact layer form a second ohmic contact between a second metal layer and the second doped region, and the dielectric regions are formed between the first and second converted contact regions.

4. The solar cell of claim 1, further comprising:
   a second metal layer formed on top of and bonded to the first metal layer to electrically connect the first converted contact regions to each other.

5. The solar cell of claim 1, wherein the first metal layer is a metal seed layer.

6. The solar cell of claim 1, wherein the first metal layer comprises a metal selected from the group consisting of copper, tin, aluminum, silver, gold, chromium, iron, nickel, zinc, ruthenium, palladium, and platinum.

7. The solar cell of claim 1, further comprising a metal foil on the first metal layer.

8. The solar cell of claim 7, further comprising a localized metal bond between the first metal layer and the metal foil.

9. The solar cell of claim 7 wherein the metal foil comprises a metal selected from the group consisting of copper, tin, aluminum, silver, gold, chromium, iron, nickel, zinc, ruthenium, palladium, and platinum.

10. The solar cell of claim 7, wherein the first metal layer and the metal foil have a same interdigitated pattern.

11. The solar cell of claim 1, wherein the first doped region is an N-type doped region.

12. The solar cell of claim 1, wherein the first doped region is a P-type doped region.

13. The solar cell of claim 1, wherein the dielectric regions of the dielectric contact layer comprise a material selected from the group consisting of silicon nitride, silicon oxide, silicon oxynitride, aluminum oxide, amorphous silicon and polysilicon.

14. A solar cell, comprising:
- a dielectric contact layer including a plurality of alternating dielectric regions and first converted contact regions, the dielectric contact layer over a first doped region of the solar cell, wherein the first converted contact regions include a dielectric that has been converted to be conductive; and
- an aluminum layer disposed on the dielectric contact layer, wherein the dielectric contact layer is continuous between the aluminum layer and the first doped region, and the first doped region and the first converted contact regions form an ohmic contact between the aluminum layer and the first doped region, and wherein the aluminum layer comprises a plurality of discrete discontinuous portions, individual ones of the plurality of discrete discontinuous portions on a corresponding one of the first converted contact regions.

15. The solar cell of claim 14, wherein the converted contact regions are separated by the dielectric regions.

16. The solar cell of claim 14, further comprising a second doped region, wherein the dielectric contact layer is formed over the second doped region such that second converted contact regions of the dielectric contact layer form a second ohmic contact between a second metal layer and the second doped region, and the dielectric regions are formed between the first and second converted contact regions.

17. The solar cell of claim 14, further comprising a metal foil on the aluminum layer.

18. A method of fabricating a solar cell, the method comprising:
- forming a dielectric contact layer including a plurality of alternating dielectric regions and first converted contact regions over a first doped region of the solar cell, wherein the first converted contact regions include a dielectric that has been converted to be conductive; and
- forming a first metal layer on the dielectric contact layer, wherein the dielectric contact layer is continuous between the first metal layer and the first doped region, and the first doped region and the first converted contact regions form an ohmic contact between the first metal layer and the first doped region, and wherein the first metal layer comprises a plurality of discrete discontinuous portions, individual ones of the plurality of discrete discontinuous portions on a corresponding one of the first converted contact regions.

19. The method of claim 18, wherein the converted contact regions are separated by the dielectric regions.

20. The method of claim 18, further comprising:
- forming a second metal layer formed on top of and bonded to the first metal layer to electrically connect the first converted contact regions to each other.

* * * * *